United States Patent [19]

Hayakawa

[11] Patent Number: 5,299,219
[45] Date of Patent: Mar. 29, 1994

[54] STRIPE-TYPE LASER DIODE USED AS A LIGHT SOURCE

[75] Inventor: Toshiro Hayakawa, Yokohama, Japan

[73] Assignee: Eastman Kodak Company, Rochester, N.Y.

[21] Appl. No.: 916,439

[22] Filed: Jul. 21, 1992

[30] Foreign Application Priority Data

Jan. 13, 1992 [JP] Japan .................................. 4-4212

[51] Int. Cl.$^5$ .............................................. H01S 3/19
[52] U.S. Cl. ........................................ 372/50; 372/46
[58] Field of Search ............................ 372/46, 45, 50

[56] References Cited

U.S. PATENT DOCUMENTS 4,875,216  10/1989  Thornton et al. ...................... 372/46
5,023,882  6/1991  Paoli ...................................... 372/46

OTHER PUBLICATIONS

A. Larson et al., "High-speed dual-wavelength demultiplexing and detection in a monolithic superlattice p-i-n waveguide detector array", Appl. Phys. Lett. 49 (5), 4 Aug. 1986.

Y. Arakawa et al., "Active Q switching in a GaAs/AlGaAs multiquantum well laser with an intracavity monolithic loss modulator", Appl. Phys. Lett. 48 (9), 3 Mar. 1986.

W. T. Tsang, "Semiconductors and Semimetals," vol. 24, pp. 397-458, Ed. R. Dingle, Academic Press, San Diego (1987).

C. J. Changhansnain, E. Kapon, and E. Colas, IEEE Journal of Quantum Electronics, vol. 26, pp. 1713-1716, Oct. 1990.

P. Gavrilovic, F. M. Timofeev, T. Haw, and J. E. Williams, IEEE Journal of Quantum Electronics, vol. 27, pp. 1859-1862, Jul., 1991.

D. R. Scifres, R. D. Burnham, and W. Streifer, Applied Physics Letters, vol. 41, p. 118-120, Jul. 1982.

D. Botez and J.C. Connolly, Applied Physics Letters, vol. 43, pp. 1096-1098 (Dec. 1983).

L. J. Mawst, D. Botez, T. J. Roth, and G. Peterson, Applied Physics Letters, vol. 55, pp. 10-12 Jul. 1989.

J. K. Butler, D. E. Ackley, and D. Botez, Applied Physics Letters, vol. 44, pp. 293-295, Feb., 1984.

J. Katz, S. Margalit, and A. Yariv, Applied Physics Letters, vol. 42, pp. 554-556, Apr. 1983.

S. Wang, Applied Physics Letters, vol. 48, pp. 1770-1772, Jun., 1986.

D. Mehuys, K. Mitsunaga, L. Eng, W. K. Marshall, and A. Yariv, Applied Physics Letters, vol. 53, pp. 1165-1167, Sep. 1988.

*Primary Examiner*—James W. Davie
*Attorney, Agent, or Firm*—Raymond L. Owens

[57] ABSTRACT

A high-power laser diode that has a wide emitting aperture and good stability to external perturbations. Structurally, the laser diode includes an array of independently-operating narrow stripe single-mode lasers coupled at each end to a single wide stripe region having a width of 30 μm or more in an arrangement which minimizes phase locking.

11 Claims, 9 Drawing Sheets

STRIPE-TYPE LASER DIODE USED AS A LIGHT SOURCE

BACKGROUND OF THE INVENTION

1. Field of the Invention

The present invention relates to a laser diode, particularly to a laser diode having a wide emission aperture for high-output operation.

2. Description of the Prior Art

In recent years optical communication technology and optical information processing are playing major roles in various fields Digital optical communication using optical fibers has made possible large increases in data communication densities, and optical disks and laser printers have produced a considerable expansion of the range of optical information processing applications.

The progress of optical communications and optical information processing technology owes much to advances made in the laser diodes used as light sources. The small size and high efficiency that are features of laser diodes have brought these devices into widespread use, for example as light sources for compact disk systems, video disk systems and optical communication networks.

In a laser diode the lasing action is generated by the injection of large quantities of carriers into the P-N junction constituting the active layer. Recent advances in semiconductor technology such as MBE (molecular beam epitaxy) and MOCVD (metal-organic chemical vapor deposition) that make it possible to form epitaxial layers as thin as 1 nm or less, have led to the realization of laser diodes that use quantum well active layers less than 20 nm thick, with higher levels of efficiency and lower drive current requirements (see W. T. Tsang in "Semiconductors and Semimetals," vol. 24, pp 397, Ed. R. Dingle, Academic Press, San Diego (1987)).

With MBE and MOCVD making it possible to grow epitaxial layers with extremely good uniformity, in recent years high-output laser diodes have been fabricated that have a wide oscillation region, in the order of 50 to 200 $\mu$m. Such lasers can be broadly divided into two types. One type has a single wide stripe whereby, for laser diode applications, it is possible to utilize epitaxial layers with good uniformity to produce laser oscillation across the whole width of the oscillation region, even when the region has a relatively large width, without giving rise to filament oscillation, that is, to the formation of an extremely fine region produced by self-focussing (see C. J. Changhansnain, E. Kapon, and E. Colas, IEEE Journal of Quantum Electronics, vol. 26, page 1713 (1990); P. Gavrilovic, F. N. Timofeev, T. Haw, and J. E. Williams, IEEE Journal of Quantum Electronics, vol. 27, page 1859 (1991)). The other type is the phase-locked array, in which multiple single-stripe laser elements, each having a stable lasing mode, are optically coupled together in a way that enables a single lasing mode to be produced from the differing individual modes of the array. Epitaxial layer formation, with the good uniformity this provides, is of critical importance for realizing a stable array mode. Array lasers, in particular, provide very sharp emission patterns owing to the phase-locked relationship derived from the elements with different stripes (see D. R. Scifres, R. D. Burnham, and W. Streifer, Applied Physics Letters, vol. 41, page 118 (1982); D. Botez and J. C. Connolly, Applied Physics Letters, vol. 43, page 1096 (1983); and L. J. Mawst, D. Botez, T. J. Roth, and G. Peterson, Applied Physics Letters, vol. 55, page 10 (1989)).

The overall relatively phasal uniformity of the light produced by the above high-output power laser diodes makes it advantageous to use them as the light source in optical disk systems, precision laser printers and other such applications requiring the type of very small spot size provided by a beam that is diffraction limited or reduced to near that point. Although MBE and MOCVD has made it possible to form highly uniform epitaxial layers, it is still not easy to achieve high power laser diodes that have a stable oscillation mode and, overall, a wide emission region As described in the above references, it is intrinsically difficult to produce lowest-order mode oscillation in wide single-stripe lasers; instead, the oscillation is usually a mixture of a multiplicity of modes of different orders. With the differences in the threshold gain needed for oscillation being very small from mode to mode, modal instability is readily caused by various changes, as described below.

In a laser array of multiple stripe elements coupled together, in principle there will be as many modes as there are stripes (see J. K. Butler, D. E. Ackley, and D. Botez, Applied Physics Letters, vol. 44, page 293 (1984)). With the small differences in the requisite gain among the modes, there is a general tendency for the gain differential to decrease as the number of stripes and possible oscillation modes increases. Moreover, increasing number of stripes increases the distance between the outermost stripes, which tends to weaken the coupling therebetween and make phase-locking difficult.

Because such conventional laser diodes having a wide emission aperture permit multiple modes each having a threshold gain that is slightly different from that of the other modes, they are sensitive to various changes. For example, increasing the injection current in order to raise the optical output produces a shortage in the supply of carriers that are converted to form the laser beam, resulting in spatial hole burning in the distribution of the carriers. The changes in the index of refraction thus caused produces distortion in the main lasing mode, increasing the mismatch between the spatial distribution of the mode intensity and the carrier distribution, giving rise to lasing of other modes that more closely match the carrier distribution in which the hole burning has occurred. Also, with the higher output there is an increase in heat which produces changes in temperature distribution, gain distribution and distribution of the index of refraction, leading to modal instability.

Moreover, when the laser is actually incorporated into a system and there is feedback of some of the emitted light caused by reflection from the various optical system components, the lasing mode can be changed by the apparent increase in reflectivity or gain produced by the stronger portions of this feedback light. The amount and the position of feedback light change with time owing to the mechanical vibration of the optical components that reflect the light, often resulting over time in fluctuations in light output caused by changes in the lasing mode. In any applications the instability caused by this type of unpredictable time-related change is the most serious problem. In the case of systems using high-output lasers, the amount of this feedback light is often the biggest obstacle to improving the optical system coupling efficiency. Methods of improving the instability of the laser itself include the use of external resonators and the external injection of light, but these increase the complexity, size and cost of the overall system and as such are not always applicable.

Because the single narrow stripe laser diode, which is used mainly as a light source in optical disk systems, is comprised of a single-mode optical waveguide that generally only allows fundamental mode operation, there is no oscillation in higher-order modes so operation is therefore highly stable However, as the optical waveguide has to be very narrow, generally 5 m or less, to realize single-mode operation, optical output power is limited by the degradation that takes place at the light emitting facet owing to the high intensity of the light. Ultimately, therefore, high output power cannot be achieved as long as the width of the light emitting facet cannot be increased.

SUMMARY OF THE INVENTION

An object of the present invention is therefore to provide a high-power laser diode that has a wide emitting aperture and good stability to external perturbations.

In accordance with the present invention, the above object is attained by a stripe type laser diode that has a light emitting aperture with a width of 30 $\mu$m or more in which at least the emitting facet and the nearby vicinity thereof are comprised of a single-stripe formation and an internal region separated from the emitting facet is comprised of a multiplicity of independent stripe type laser diodes in which phase-locking is minimized.

In the present invention the internal structure that determines the oscillation mode and gain of the laser diodes is constituted by multiple independently-operating narrow stripe single-mode lasers that are arrayed together, and in order not to realize phase locking each is coupled to a single wide stripe region having a width of 30 $\mu$m or more that is located near the light emitting facet and the vicinity thereof so as to thereby improve the upper limit of the light quality, as determined by the width of the emitting facet. As the laser beam thus obtained lacks phasal coherence it is not suitable for applications requiring the type of small spot provided by a beam that is diffraction limited, but it can readily be used in applications requiring a spot size ranging from several micrometers up to several tens of micrometers. Examples of such applications include exciting light sources of solid-state lasers, relatively low-density laser printer light sources and light sources used for processing and medical treatment. Moreover, by making it possible to reduce the light intensity at the light emitting facet to a lower level compared to simply forming an array of independent single-stripe lasers, the structure of this invention provides an improvement in maximum optical output power and reliability, while a further advantage is that there is a low level of fall-off of light intensity between stripes that results in a more uniform light intensity distribution.

Further features of the invention, its nature and various advantages will become more apparent from the accompanying drawings and following detailed description of the invention.

DESCRIPTION OF THE PREFERRED EMBODIMENT

Figure 1:
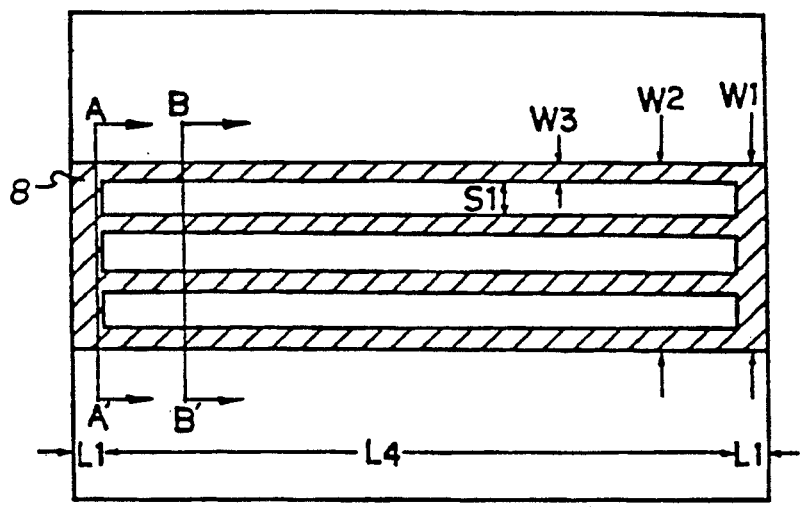
FIG. 1 is a plan view representation of a laser diode according to a first embodiment of the present invention.
Figure 2:
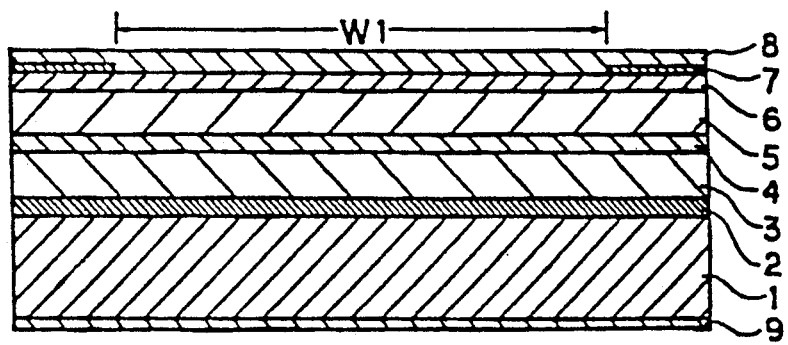
FIG. 2 a cross-sectional view of a laser diode of the first embodiment.
Figure 3:
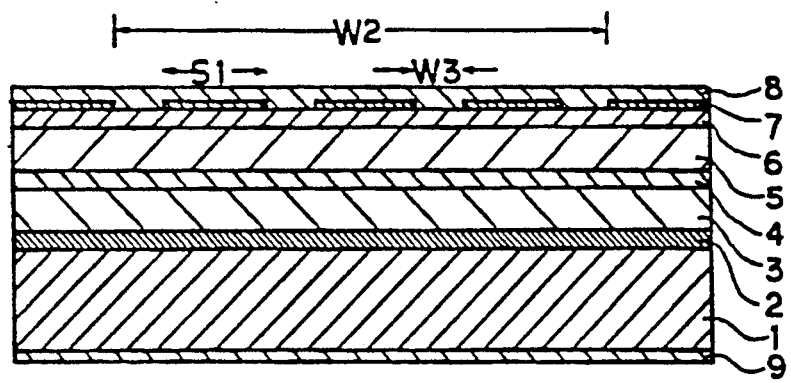
FIG. 3 is also a cross-sectional view of a laser diode of the first embodiment.

FIG. 1 is a plan view of a laser diode according to a first embodiment of the invention, showing the stripe arrangement. FIGS. 2 and 3 are cross-sectional views along lines A-A' and B—B', respectively, of the embodiment shown in FIG. 1. Molecular beam epitaxy (MBE) was used to form an n-GaAs buffer layer 2 (Si=1×10$^{18}$cm$^{-3}$, 0.5 $\mu$m thick) on an n-GaAs substrate 1 (Si=2×10$^{18}$ cm$^{-3}$) with a (100 orientation, and this was followed by the formation of an n-Al$_{0.5}$Ga$_{0.5}$As cladding layer 3 (Si=1×10$^{18}$cm$^{-3}$, 1.5 $\mu$m thick), a non-doped active region 4, a p-Al$_{0.5}$Ga$_{0.5}$As cladding layer 5 (Be=5×10$^{17}$cm$^{-3}$, 0.8 $\mu$m thick) and a p-GaAs cap layer 10 (Be=1×10$^{19}$dm$^{-3}$, 0.2 $\mu$m thick). The non-doped active region 4 is comprised of a non-doped Al$_{0.2}$Ga$_{0.8}$As optical waveguide layer (0.1 $\mu$m thick), a non-doped GaAs quantum well layer (0.01 $\mu$m thick), and a non-doped Al$_{0.2}$Ga$_{0.8}$As optical waveguide layer (0.1 $\mu$m thick).

A SiN$_x$ layer 7 (250 nm thick) was then formed by means of plasma CVD, and photolithography together with chemical etching using dilute HF were then used to remove part of the SiN$_x$ layer so as to form windows in the hatched portion of FIG. 1. These windows define two spaced single-stripes adjacent to the two emitting facets. An internal region has a plurality of independent stripes (forming independent laser diodes). The light emitting aperture is defined by the width W1 of each single-stripe. Finally, vacuum deposition was used to form a Mo/Au electrode layer 8 on the p-GaAs cap layer 10 side and a AuGe/Ni/Au electrode layer 9 on the n-GaAs substrate side, which was followed by annealing at 450° C. for five minutes to form ohmic electrodes. The width W3 of one internal stripe was set at 7 μm and the spacing S1 between stripes at 15 μm. In the case of this embodiment, this therefore produced a total stripe region width of 73 μm for both W1 and W2. With a resonator length of 700 μm, the length L4 of each of the narrow stripes was set at 650 μm and the length L1 of the wide stripe portion at each end was set at 25 μm. Electron-beam deposition was then used to provide the front end of the device thus formed with an $Al_2O_3$ coating with a reflectance of 10% and the rear end with a multilayer coating of 95% reflectance $Al_2O_3$ followed by amorphous silicon, this sequence being then repeated. The device wafer was then cut into chips 500 m wide which were then each In-soldered onto a copper heat sink on the p-electrode side, and device characteristics were measured. When operated continuously at 25° C. the device oscillated at a wavelength of 850 nm and a threshold current of 130 mA, producing an optical output of 1 W or more from the front end. Because mode coupling between adjacent devices that have a phase differential of 180 degrees is facilitated by the use of a gain waveguide type structure for the single-stripe lasers, in this embodiment, a relatively large stripe-to-stripe spacing S1 of 15 μm is used to minimize or prevent phase locking. Also, although the effect is weak, increasing the length L1 of the wide single-stripe end regions gives rise to phase locking when part of the light diffracted from an internal stripe and reflected at the device end portion back into the interior region couples with an adjacent internal stripe (see J Katz, S. Margalit, and A. Yariv, Applied Physics Letters, vol. 42, page 554 (1983), S. Wang, Applied Physics Letters, vol. 48, page 1770 (1986), and D. Mehuys, K. Mitsunaga, L. Eng, W. K. Marshall, and A. Yariv, Applied Physics Letters, vol. 53, page 1165 (1988)). In this embodiment phase locking was suppressed by using a large stripe-to-stripe spacing S1 of 15 μm and a small L1 of 25 μm. This coupling showed a horizontal single-peak far-field pattern laser light with a full-width at half maximum of around 15 degrees, the same pattern as that of narrow single-stripe lasers.

Figure 18:
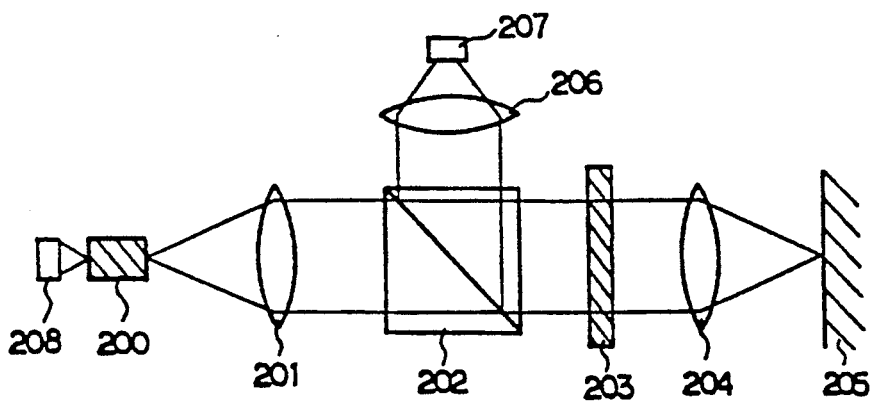
FIG. 18 is a drawing showing the structure of the feedback light evaluation system according to the present invention.

The device according to this embodiment was incorporated into the feedback light evaluation system shown in FIG. 18 to evaluate the effect of the feedback light. The laser beam emitted by a laser diode 200 is focussed onto an aluminum mirror 205 by a collimator lens 201 and a condenser lens 204, and is thereby fed back along the same route to the emitting facet of the laser diode. A fine-adjustment stage and piezoelectric device enable the mirror 205 to be moved and the phase and position of the feedback light to be altered. A beamsplitter 202 directs a portion of the feedback light via a condenser lens 206 to a photodetector 207, to measure the amount of feedback light. Variation in the optical output power of the laser diode was measured by a photodetector 208 located at the rear. The amount of feedback light can be changed by adjusting the transmissivity of an attenuation filter 203 inserted into the light path When the device was operated at a constant current of 800 mA for an output of around 500 mW, the output showed no more than 4% variation even when feedback light was 5% or more. Using MBE, a single-stripe laser 50 μm wide was formed on a wafer to fabricate a laser diode having the same structure. However, while this laser diode showed the same type of optical output power—current characteristics as the above embodiment, it displayed a far field pattern with a fine structure with multiple overlapping modes and an optical output power variation of 8 to 10% or more at a feedback light level of 5% or more.

Figure 4:
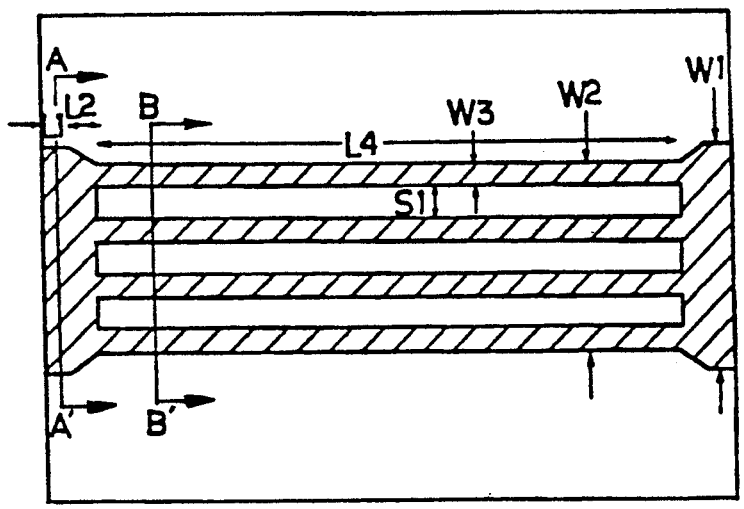
FIG. 4 is a plan view representation of a laser diode according to a second embodiment of the invention.
Figure 5:
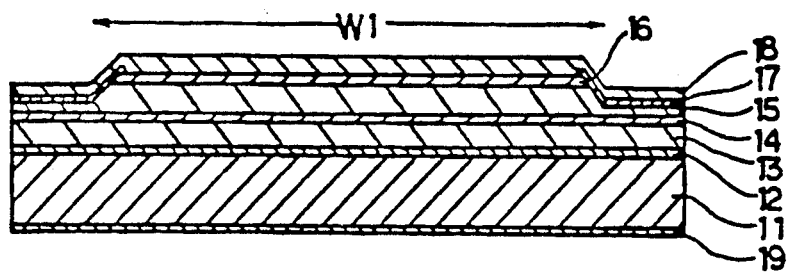
FIG. 5 is a cross-sectional view of a laser diode of the second embodiment.
Figure 6:
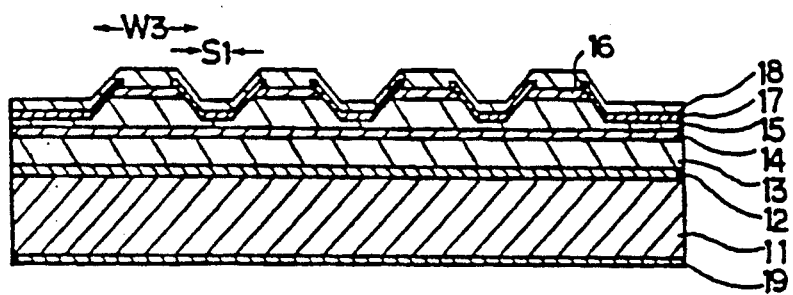
FIG. 6 is also a cross-sectional view of a laser diode of the second embodiment.

The width W1 (which defines the light emitting aperture) should be 30 μm or more to improve the light quality as discussed above. The interior stripes are selected to provide independent laser diodes wherein phase locking is substantially minimized or prevented. FIG. 4 is a plan view showing the stripe arrangement of a laser diode according to a second embodiment of the invention. The difference compared with the first embodiment is that the width W1 (length L1 portion) of the wide stripe region at each end has been made greater than the total width W2 (length L4 portion) of the inner array portion The device of this embodiment has a wide stripe region that is arranged between the above two regions, this stripe region being such that the stripe has a continuously changing width (length L2 portion). FIGS. 5 and 6 are cross-sectional views along lines A—A' and B—B', respectively, of the embodiment shown in FIG. 4. To fabricate the device, MBE was used to form an n-GaAs buffer layer 12 ($Si=1\times10^{18}cm^{-3}$, 0.5 μm thick) on an n-GaAs substrate 11 ($Si=2\times10^{18}cm^{-3}$) with a (100) orientation, and this was followed by the formation of an n-$Al_{0.5}Ga_{0.45}As$ cladding layer 13 ($Si=1\times10^{18}cm^{-3}$, 1.5 μm thick), a non-doped active region 14, a p-$Al_{0.5}Ga_{0.5}Ga_{0.45}As$ cladding layer 15 ($Be=5\times10^{17}cm^{-3}$, 0.8 μm thick) and a p-GaAs cap layer 16 ($Be=1\times10^{19}cm^{-3}$, 0.2 μm thick). The non-doped active region 14 is comprised of a non-doped $Al_{0.25}Ga_{0.75}As$ optical waveguide layer (0.15 μm thick), a non-doped $Al_{0.05}Ga_{0.95}As$ quantum well layer (7 nm thick), and a non-doped $Al_{0.25}Ga_{0.75}As$ optical waveguide layer (0.15 μm thick).

Following this MBE growth process, photolithography and chlorine ECR plasa etching are used to form mesas as shown in FIGS. 5 and 6, which correspond to the arrangement shown in FIG. 4. In non-mesa portions, the p-$Al_{0.5}Ga_{0.45}As$ cladding layer 15 was etched until 1 μm of the layer was left. With reference to FIG. 6, the width W3 of the stripe mesa base was set at 4 μm, the spacing S1 between stripes at 5 μm and the length L4 thereof at 500 μm. With reference to FIG. 5, the width W1 of the end stripe region was set at 50 μm, the length L1 at 20 μm and the length L2 of the tapered portion at 20 μm. This produced a length of 580 μm for the resonator.

Following the etching, plasma CVD was used to form a $SiN_x$ layer 17 (2500 thick) and photolithography together with chemical etching using dilute HF were then used to remove part of the $SiN_x$ layer so as to form a window for the p-electrode. Finally, vacuum deposition was used to form a Mo/Au electrode layer 18 on the p-GaAs cap layer 16 side and a AuGe/Ni/Au electrode layer 19 on the n-GaAs substrate 1 side, which was followed by annealing at 450° C. for five minutes to form ohmic electrodes.

Cleaving was then used to form reflecting surfaces on the ends, and electron-beam deposition was then used to provide the front end of the device with an $Al_2O_3$ coating having a reflectance of 10%, and the rear end was provided with a multilayer coating of 95% reflectance $Al_2O_3$ followed by amorphous silicon, this sequence being then repeated. The wafer was then cut into chips 500 μm wide which were then each In-soldered onto a copper heat sink on the p-electrode side and the characteristics were measured. With a pulsed drive current (1

μm pulses at a frequency of 1 kHz) at 25° C. the device oscillated at a threshold current of 70 mA, producing an optical output of 1 W or more from the front end. This coupling showed a horizontal single-peak far-field pattern laser light with a full-width at half maximum of around 11 degrees, the same pattern as that of narrow single-stripe lasers. The device according to this embodiment was incorporated into the feedback light evaluation system shown in FIG. 18 to evaluate the effect of the feedback light. When the device was operated at a constant current of 70 mA for an output of around 500 mW, output did not vary by more than 2% even when feedback light was 5% or more. A laser diode having the same structure that was fabricated by using MBE to form a single-stripe laser having the cross-section shown in FIG. 5 with a width W1 of 50 μm displayed an optical output power variation of 8 to 10% or more at a feedback light level of 5% or more.

Figure 7:
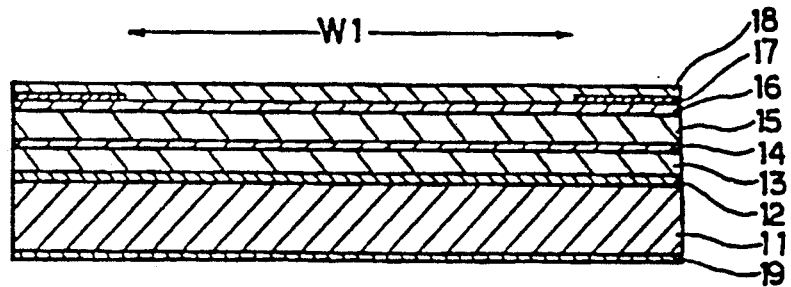
FIG. 7 is a cross-sectional view of a laser diode according to another embodiment of the invention.

Although the invention has been described with reference to the above two embodiments, in its the basic structure the invention consists of preventing phase-locking of multiple narrow-stripe lasers by using a single wide stripe to couple the narrow stripes at the end region, and as such various arrangements are possible. In the second embodiment, for example, the end regions corresponding to L1 and L2 in FIG. 4 could be formed as the flat stripes shown in FIG. 7 rather than the mesa formation of FIG. 5, with mesas only being used for the internal regions as shown in FIG. 6.

Figure 8:
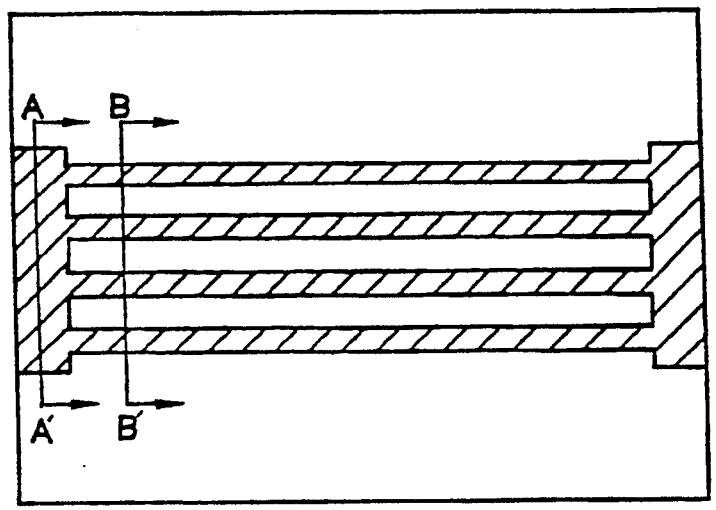
FIG. 8 is a cross-sectional view of a laser diode according to another embodiment of the invention.
Figure 9:
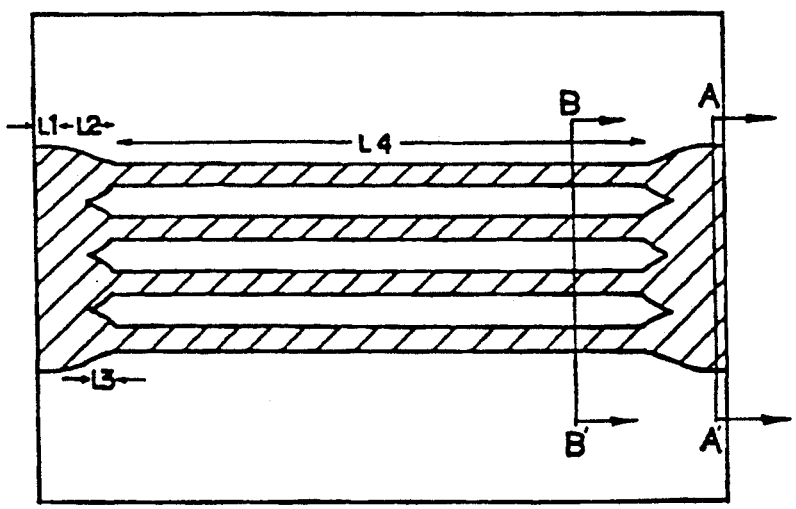
FIG. 9 is a plan view of a laser diode according to another embodiment of the invention.
Figure 10:
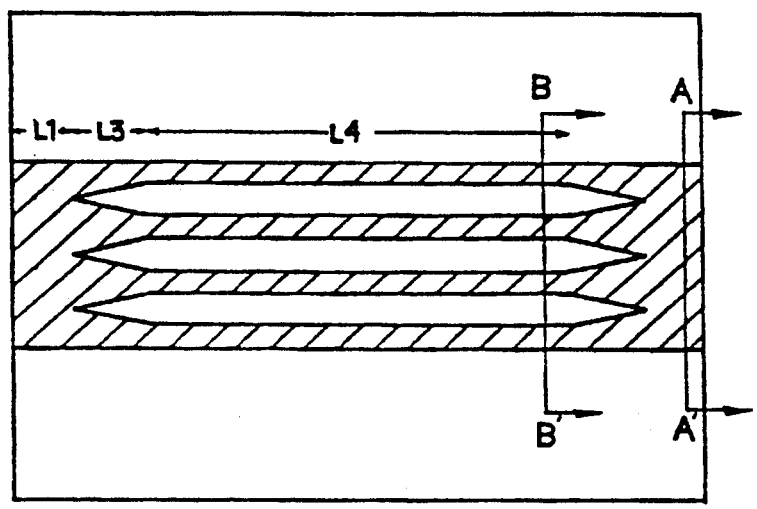
FIG. 10 is a plan view of a laser diode according to an embodiment of the invention.
Figure 11:
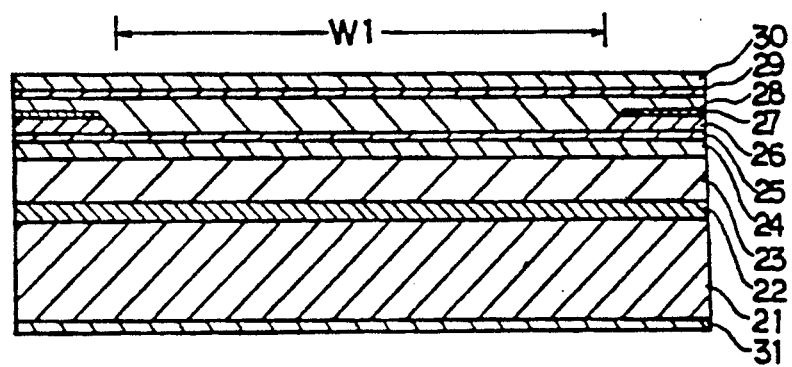
FIG. 11 is a cross-sectional view of a laser diode to another embodiment of the invention.
Figure 12:
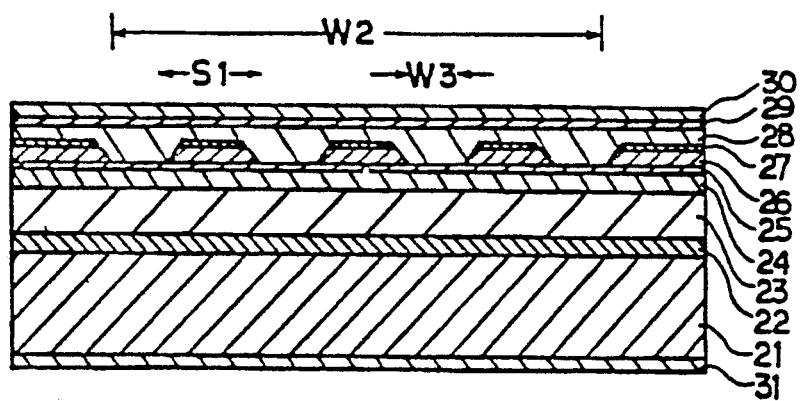
FIG. 12 is a cross-sectional view of a laser diode according to another embodiment of the invention.

Similarly, there are also various ways the stripes can be coupled, and various shapes for the stripes. FIG. 8 shows one example in which the tapered portion has been straightened by broadening it out. As shown in other example, that of FIG. 9, the ends of the narrow stripes ay also each be provided with a tapered portion (L3), or, as in FIG. 10, these tapered portions L3 may be provided only on the inside, and the same overall width used for the end regions and narrow stripe portion The structure of the laser diode stripes is not limited to those shown in FIGS. 1 and 4, as any structure may be used that provides modal stability in narrow stripe single mode lasers. The self-matching type stripe structure shown in FIGS. 11 and 12 is an example of another applicable structure that is in widespread use. To fabricate the device, MOCVD was used to form an n-GaAs buffer layer 22 (Se=$1\times10^{18}$cm$^{-3}$, 0.5 μm thick) on an n-GaAs substrate 21 (Si=$2\times10^{18}$cm$^{-3}$) with a (100) orientation, and this was followed by the formation of an n-Al$_{0.3}$Ga$_{0.7}$As cladding layer 23 (Se=$1\times10^{18}$cm$^{-3}$, 1.5 μm thick), a non-doped GaAs active region 24 (0.06 μm thick) a p-Al$_{0.3}$Ga$_{0.7}$As cladding layer 25 (Zn=$5\times10^{17}$cm$^{-3}$, 0.2 μm thick), a n-Al$_{0.45}$Ga$_{0.55}$As current blocking layer 26 (Se=$1\times10^{18}$cm$^{-3}$, 0.8 μm thick) and an n-GaAs current blocking layer 27 (Se=$1\times10^{18}$cm$^{-3}$, 0.2 μm thick). Photolithography and chemical etching were then used to form stripe regions of a prescribed shape such as that shown in FIG. 10, for example, by selectively removing the current blocking layers 26 and 27. Following this, MOCVD was again used to form a p-Al$_{0.3}$Ga$_{0.7}$As cladding layer 28 (Zn=$5\times10^{17}$cm$^{-3}$, 1.2 μm thick) and a p-GaAs cap layer 29 (Zn=$1\times10^{19}$cm$^{-3}$, 0.2 μm thick). To finish, vacuum deposition was used to form a Ti/Pt/Au electrode layer 30 on the p-GaAs cap layer side and a AuGe/Ni/Au electrode layer 31 on the n-GaAs substrate side, which was followed by annealing at 450° C. for five minutes to form ohmic electrodes.

Figure 13:
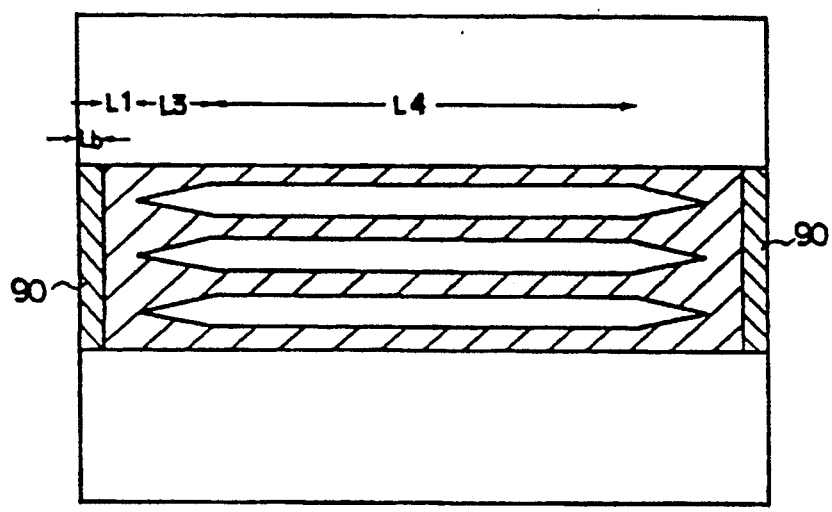
FIG. 13 is a plan view of a laser diode according to another embodiment of the invention.
Figure 14:
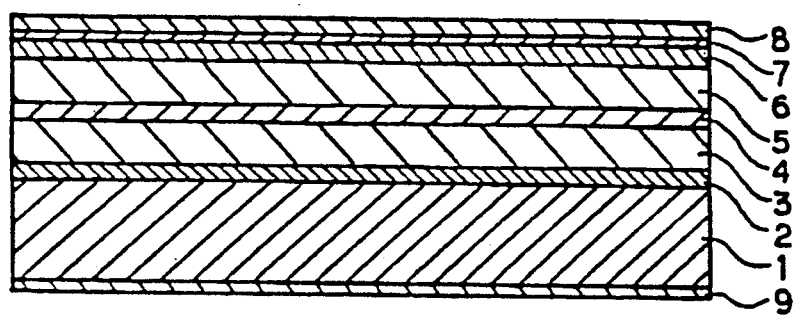
FIG. 14 is a cross-sectional view of a laser diode according to another embodiment of the invention.
Figure 15:
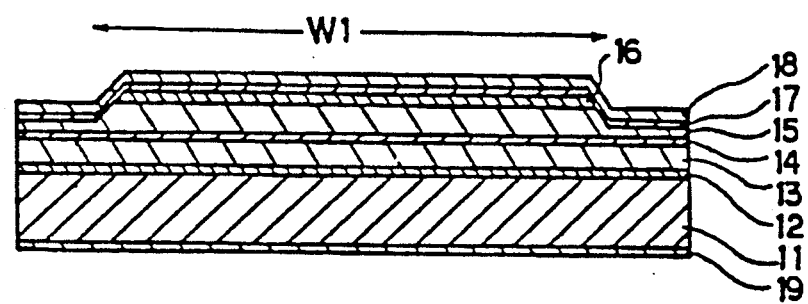
FIG. 15 is a cross-sectional view of a laser diode according to another embodiment of the invention.

As another embodiment, this invention could be configured, as shown by FIG. 13, by providing the ends with a region 90 (length Lb portion) in which no current injection takes place. The addition of such a current non-injection region would reduce degradation caused by heat generation and photochemical reactions in the end portions, thereby improving reliability. While the arrangement of FIG. 13 is a variation on the embodiment shown in FIG. 10, the provision of a current non-injection region is also readily applicable to other configurations. With reference to the configuration cross-section shown in FIG. 2, the current non-injection region could be provided by not removing the SiN$_x$ layer 7 as shown in FIG. 14, and this also applies to the configuration of FIG. 7. With respect also to the configuration of FIG. 5, the current non-injection region could be provided by not removing the SiN$_x$ layer 17, as shown in FIG. 15.

Figure 16:
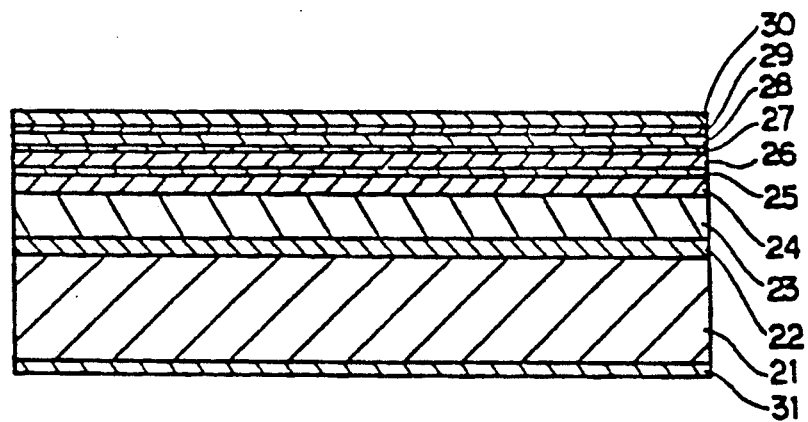
FIG. 16 is a cross-sectional view of a laser diode according to another embodiment of the invention.
Figure 17:
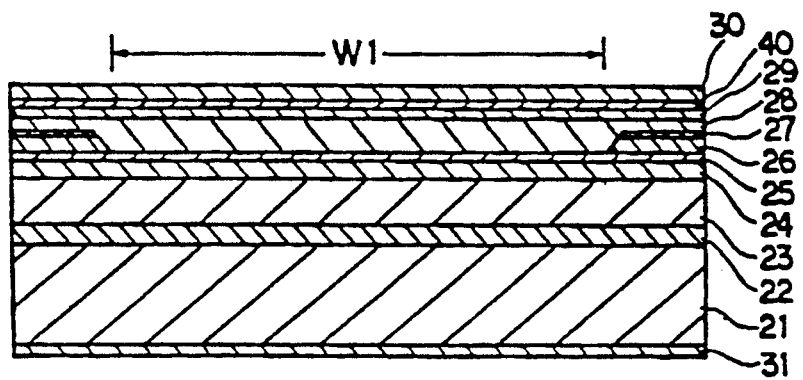
FIG. 17 is a cross-sectional view of a laser diode according to another embodiment of the invention.

Again, the arrangement of FIG. 12 has current blocking layers 26 and 27, so as shown in FIG. 16 the current non-injection region could be provided by not removing the blocking layer portions This would, however, affect the profile of the laser light. As such, it is instead also possible to provide the configuration of FIG. 11 with a current non-injection region by adding a SiN$_x$ layer 40, as shown in FIG. 17.

Although the embodiments of the invention have been described with reference to an internal configuration of four stripes, it is to be understood that the invention is not limited thereto. Instead, the number of stripes may be set in accordance with the requirements of the application concerned. Similarly, although the above embodiments have been described with reference to GaAs/AlGaAs system laser diodes, it is to be understood that the present invention is not limited thereto but may be applied to a laser diode of other materials such as InGaAs, AlInGaAs, AlGaInP, and InGaAsP, for example.

The invention has been described in detail with particular reference to certain preferred embodiments thereof, but it will be understood that variations and modifications can be effected within the spirit and scope of the invention.

What is claimed is:

1. In a stripe type laser diode, the improvement comprising:
   a first single waveguide having a width of 30 μm or more which devines a light emitting aperture of an emitting facet; and
   a plurality of internal waveguides connected to the single waveguide and selected in configuration to define an array of independent stripe type laser diodes wherein phase-locking is minimized in the output light.

2. The stripe-type laser diode of claim 1 including a second single waveguide spaced from the first waveguide having a width of 30 μm or more and connected to the array of diodes.

3. The stripe-type laser diode of claim 2 wherein the first and second waveguides have a width greater than the diode array width.

4. The stripe-type laser diode of claim 3 wherein each single waveguide continuously changes in width.

5. The stripe-type laser diode of claim 2 wherein the spacing between internal waveguides and the length of the single waveguides are selected to minimize phase locking.

6. The stripe-type laser diode of claim 1, wherein the single waveguide is in the form of a stripe.

7. The stripe-type laser diode of claim 1, wherein the plurality of internal waveguides are in the form of stripes.

8. The stripe-type laser diode of claim 2, wherein the first and second waveguides are in the form of a stripe.

9. The stripe-type laser diode of claim 8, wherein the first and second waveguide have end regions that form mesas.

10. The stripe-type laser diode of claim 8, wherein the first and second waveguides have end regions that form flat stripes.

11. The stripe-type laser diode of claim 8, wherein the first and second waveguides have end regions that are tapered.

* * * * *